US012776749B2

(12) United States Patent
Chen et al.

(10) Patent No.: US 12,776,749 B2
(45) Date of Patent: Oct. 27, 2026

(54) RADIO FREQUENCY MODULE, POWER SUPPLY CONTROL METHOD, AND COMMUNICATION DEVICE

(71) Applicant: GUANGDONG OPPO MOBILE TELECOMMUNICATIONS CORP., LTD., Dongguan (CN)

(72) Inventors: Feng Chen, Dongguan (CN); Lin Tong, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 15 days.

(21) Appl. No.: 19/220,334

(22) Filed: May 28, 2025

(65) Prior Publication Data

US 2025/0286510 A1 Sep. 11, 2025

Related U.S. Application Data

(63) Continuation of application No. PCT/CN2023/122940, filed on Sep. 28, 2023.

(30) Foreign Application Priority Data

Nov. 30, 2022 (CN) ......................... 202211519726.7

(51) Int. Cl.
*H03F 1/00* (2006.01)
*H03F 3/24* (2006.01)
*H04B 1/401* (2015.01)

(52) U.S. Cl.
CPC ............... *H03F 1/00* (2013.01); *H03F 3/245* (2013.01); *H04B 1/401* (2013.01); *H03F 2200/451* (2013.01)

(58) Field of Classification Search
CPC ...... H03F 1/00; H03F 3/245; H03F 2200/451; H04B 1/401
See application file for complete search history.

(56) References Cited

U.S. PATENT DOCUMENTS

2018/0254759 A1* 9/2018 Tsutsui .................. H04B 1/006
2018/0375479 A1* 12/2018 Bai ...................... H03F 1/0216
(Continued)

FOREIGN PATENT DOCUMENTS

CN 114531163 A 5/2022
CN 114696867 A 7/2022
(Continued)

OTHER PUBLICATIONS

WIPO, International Search Report and Written Opinion for PCT Application No. PCT/CN2023/122940 mailed on Nov. 24, 2023.
(Continued)

*Primary Examiner* — Freshteh N Aghdam
(74) *Attorney, Agent, or Firm* — Sheppard, Mullin, Richter & Hampton LLP

(57) ABSTRACT

Provided are a radio frequency module, a power supply control method, and a communication device. The radio frequency module includes at least two power modules, at least two transmission groups and a power supply control circuit. Each transmission group includes at least two power amplifier modules, each power amplifier module is switchably connected to any one of the at least two power modules, and individual power amplifier modules in a same transmission group are configured to perform power amplification on received radio frequency signals under power supply of a same power module. Working statuses of individual power amplifier modules are acquired by the power supply control circuit, and an abnormal transmission group where an abnormal power amplifier module is located may be determined therefrom, and each normal power amplifier module in the
(Continued)

abnormal transmission group is controlled to switch to being connected with a target power module.

20 Claims, 6 Drawing Sheets

(56) References Cited

U.S. PATENT DOCUMENTS

| | | | | |
|---|---|---|---|---|
| 2021/0391834 | A1* | 12/2021 | Okabe | H03F 1/0261 |
| 2022/0029588 | A1* | 1/2022 | Cao | H03F 1/565 |
| 2024/0146260 | A1* | 5/2024 | Li | G05F 1/56 |
| 2026/0081702 | A1* | 3/2026 | Vahid Far | H04B 1/0483 |

FOREIGN PATENT DOCUMENTS

| | | | | | |
|---|---|---|---|---|---|
| CN | 114826436 | A | * | 7/2022 | H04B 1/04 |
| CN | 115208418 | A | | 10/2022 | |

OTHER PUBLICATIONS

EPO, European Search Report for EP Application No. 23896256.7, Feb. 19, 2026, 5 pages.

* cited by examiner

RADIO FREQUENCY MODULE, POWER SUPPLY CONTROL METHOD, AND COMMUNICATION DEVICE

CROSS-REFERENCE OF RELATED APPLICATION

This application is a continuation of International Application No. PCT/CN2023/122940 filed Sep. 28, 2023, which claims priority to Chinese Patent Application No. 202211519726.7 filed Nov. 30, 2022, all contents of which are hereby incorporated by reference.

TECHNICAL FIELD

The present disclosure relates to the field of antenna technology, and in particular to a radio frequency module, a power supply control method, and a communication device.

BACKGROUND

The statements herein merely provide background information related to the present disclosure, and they do not necessarily constitute exemplary techniques.

With the development of radio frequency technology, a communication device usually includes therein at least two power amplifier modules. The power amplifier (PA) in each power amplifier module is used to amplify a weak signal generated by a radio frequency transceiver into a high-power strong signal, so that the amplified signal is radiated into free space through an antenna for communication with a base station.

However, in the architecture with at least two power amplifier modules, when an abnormality, such as burning out, occurs in one PA, other PAs powered by a same power module as this one PA may not work properly, which affects the user experience.

SUMMARY

According to various embodiments of the present disclosure, a radio frequency module, a power supply control method, and a communication device are provided.

In a first aspect, the embodiments of the present disclosure provide a radio frequency module, including:

at least two power modules;

at least two transmission groups, where each of the transmission groups includes at least two power amplifier modules, each of the power amplifier modules is switchably connected to any one of the at least two power modules, and the individual power amplifier modules in a same transmission group are configured to perform power amplification on received radio frequency signals under power supply of a same power module; and a power supply control circuit, configured to acquire working statuses of the individual power amplifier modules in each of the transmission groups, determine, based on the working statuses, an abnormal transmission group in which there is an abnormal power amplifier module, and control each normal power amplifier module in the abnormal transmission group to switch from being connected with a currently connected power module to being connected with a target power module, the target power module being any one of the at least two power modules except the currently connected power module.

In a second aspect, the embodiments of the present disclosure provide a power supply control method, including:

acquiring working statuses of individual power amplifier modules in each transmission group; and determining, based on the working statuses, an abnormal transmission group in which there is an abnormal power amplifier module, and controlling each normal power amplifier module in the abnormal transmission group to switch from being connected with a currently connected power module to being connected with a target power module;

where the target power module is any one of at least two power modules except the currently connected power module; there are at least two transmission groups, each of the transmission groups includes at least two power amplifier modules, each of the power amplifier modules is switchably connected to any one of the at least two power modules, and the individual power amplifier modules in a same transmission group are configured to perform power amplification on received radio frequency signals under power supply of a same power module.

In a third aspect, the embodiments of the present disclosure provide a communication device including the radio frequency module as described above.

The details of one or more embodiments of the disclosure are set forth in the accompanying drawings and the description below. Other features, objects, and advantages of the present disclosure will be apparent from the description, drawings, and claims.

BRIEF DESCRIPTION OF THE DRAWINGS

In order to more clearly illustrate the embodiments of the present disclosure or the technical solutions in the prior art, drawings required for use in the description of the embodiments or the prior art will be briefly introduced below. Apparently, the drawings described below are only some embodiments of the present disclosure. For those of ordinary skill in the art, other drawings can be obtained based on these drawings without paying creative work.

DETAILED DESCRIPTION OF PREFERRED EMBODIMENTS

In order to make the objects, technical solutions and advantages of the present disclosure more clearly understood, the present disclosure is further described in detail below in conjunction with the drawings and embodiments. It should be understood that the specific embodiments described herein are only used to explain the present disclosure and are not used to limit the present disclosure.

It can be understood that terms “first”, “second”, etc. used in the present disclosure may be used herein to describe various elements, but these elements are not limited by these terms. These terms are used only to distinguish a first element from another element, and should not be understood as indicating or implying relative importance or implicitly indicating the number of the involved technical features. Therefore, a feature defined by “first” or “second” may explicitly or implicitly include at least one such feature. In the description of the present disclosure, “multiple/plurality of” means at least two, for example, two, three, etc., unless otherwise clearly and specifically defined.

It is notable that, when an element is described as being “installed on” another element, it may be directly on the other element or there may be an element located therebetween. When an element is considered to be “connected to/with” another element, it may be directly connected to the another element or there may be also an intermediate element.

The radio frequency system involved in the embodiments of the present disclosure may be applied to a communication device with a wireless communication function, and such communication device may be a handheld device, a vehicle-mounted device, a smart car, a wearable device, a computing device or other processing devices connected to wireless modems, as well as various user equipment (UE) (for example, mobile phones), mobile stations (MS), etc. For the convenience of description, the above-mentioned devices are collectively referred to as a communication device.

Figure 1:
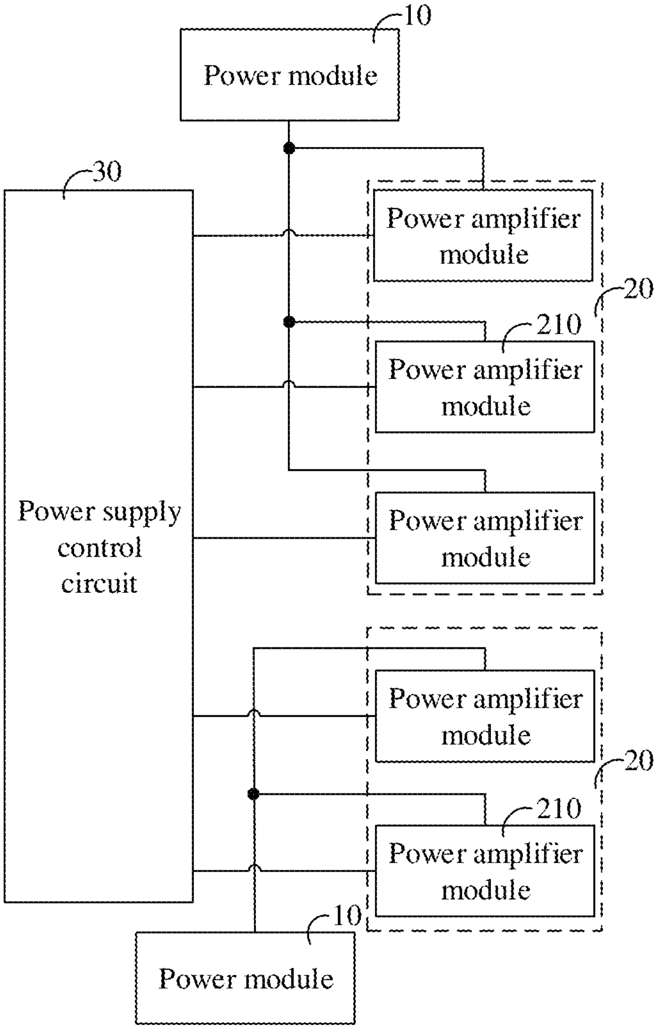
FIG. 1 is a first structural block diagram of a radio frequency module according to some embodiments.

FIG. 1 is a structural block diagram of a radio frequency module according to some embodiments. Referring to FIG. 1, in the embodiments, the radio frequency module includes at least two power modules 10, at least two transmission groups 20 and a power supply control circuit 30.

Each transmission group 20 includes at least two power amplifier modules 210, each power amplifier module 210 is switchably connected to any one of the at least two power modules 10, and the individual power amplifier modules 210 in a same transmission group 20 are configured to perform power amplification on received radio frequency signals under power supply of a same power supply (FIG. 1 only shows a situation in which the power amplifier modules 210 in each transmission group 20 are connected with a power module, and does not show a situation in which the power amplifier modules 210 in each transmission group 20 are disconnected from other power modules 10). The power supply control circuit 30 is configured to acquire working statuses of the individual power amplifier modules 210 in each transmission group 20, determine, based on the working statuses, an abnormal transmission group in which there is an abnormal power amplifier module, and control each normal power amplifier module in the abnormal transmission group to switch from being connected with a currently connected power module 10 to being connected with a target power module. The target power module is any one of the at least two power modules 10 except the currently connected power module 10.

The number of the power modules 10 is at least two, each power module 10 may be connected with each of the power amplifier modules 210 in a same transmission group 20, or may also be connected with multiple power amplifier modules 210 in different transmission groups 20. When the power module 10 is connected with a power amplifier module 210, the power module 10 provides a power supply signal to the connected power amplifier module 210, so that the power amplifier module 210 performs power amplification on its received radio frequency signal. In some implementations, the power module 10 may perform voltage regulation according to a frequency band of the radio frequency signal for which the power amplifier module 210 needs to perform power amplification, so as to output a power supply signal suitable for the normal operation of the power amplifier module 210, thereby meeting the requirements of the user. The power module 10 may include for example a battery and a power management chip (power management IC, PMIC) connected to the battery, where the power of the battery is adjusted and then provided to the power amplifier module 210.

The number of the transmission groups 20 is at least two, and each transmission group 20 includes at least two power amplifier modules 210. As such, since the radio frequency module includes multiple power amplifier modules 210, the multiple power amplifier modules 210 may provide multiple transmission channels, so that the radio frequency module supports multi-channel transmission, thereby improving the communication quality and the user experience. In some implementations, the multiple power amplifier modules 210 may be grouped based on whether the radio frequency signals received by the individual power amplifier modules 210 are in a same transmission channel group in actual application, so that multiple power amplifier modules 210 connected to a same transmission channel group may belong to a same transmission group 20. In some implementations, the multiple power amplifier modules 210 may be grouped based on frequency bands of the radio frequency signals that need power amplification. For example, some power amplifier modules 210 supporting a low-frequency band, a medium-frequency band or a high-frequency band may be in a same transmission group 20, and some power amplifier modules 210 supporting a high-frequency band or an ultra-high frequency band may be in a same transmission group 20, so as to support combinations of different frequency bands. The power amplifier modules 210 may also be grouped based on the power supply requirements thereof, for example, different power amplifier modules 210 with similar power supply requirements may be in a same transmission group 20. It is notable that the embodiments are not limited to the above-mentioned grouping manner, which may be set as required.

Each power amplifier module 210 is switchably connected to any one of the at least two power modules 10, and the individual power amplifier modules 210 in a same transmission group 20 are configured to perform power amplification on the received radio frequency signals under the power supply of a same power module. Generally, when all the transmission groups 20 are powered normally, different power modules 10 are connected by default to different transmission groups 20 and thus the power amplifier modules 210 therein. It can be understood that, the switchable connection means that each power amplifier module 210 is capable of being connected to each of the at least two power modules 10 and it is connected to one of the power modules 10 at a time, and the connection between the power amplifier module 210 and each of the power modules 10 may be made available through a switching operation.

Each power amplifier module 210 may include one or more power amplifiers (PAs). The power terminal of each PA is switchably connected to one of the at least two power modules 10. The input terminal of each PA is connected to a radio frequency transceiver to receive the radio frequency signal. The output terminal of each PA is connected to an antenna or other radio frequency front-end modules. When a PA is connected with a power module, the PA performs power amplification on a received radio frequency signal and outputs the radio frequency signal after undergoing power amplification to the antenna for transmission outward. In some implementations, the power supply control circuit 30 may include the radio frequency transceiver. When the power supply control circuit 30 includes the radio frequency transceiver, the power supply control circuit 30 may be connected with the input terminal of each power amplifier module 210 to provide a radio frequency signal to each power amplifier module 210 (taking FIG. 1 as an example, it shows the connection between the power supply control circuit 30 and each power amplifier module 210).

In some implementations, the power amplifier module 210 may further include other functional components to implement other auxiliary functions, for example, it may further include a low-noise amplifier to further implement a receiving function. When the power amplifier module 210 also includes a low-noise amplifier, the power amplifier module 210 may be a low-frequency power amplifier module with a built-in low-noise amplifier (LB L-PA Mid, Low Band PA Mid With LNA), or a medium-high frequency power amplifier module with a built-in low-noise amplifier (MHB L-PA Mid, Middle and High Band PA Mid With LNA). In addition, it may also be a power amplifier switch module integrated with a filter and a low-noise amplifier (LPAF, LNA-PA ASM module with integrated filter), etc. For example, it may be an LPAF that supports high-frequency signals or ultra-high frequency signals.

The power supply control circuit 30 is configured to acquire the working statuses of the individual power amplifier modules 210 in each transmission group 20, determine, based on the working statuses, an abnormal transmission group in which there is an abnormal power amplifier module, and control each normal power amplifier module in the abnormal transmission group to switch from being connected with a currently connected power module to being connected with a target power module. The target power module is any one of the at least two power modules 10 except the currently connected power module 10.

The working status of each power amplifier module 210 includes a normal working status and an abnormal working status. In the power amplifier module 210, the PA is a high-power device and is often in a high-temperature, high-power and high-current working scenario, and may has a small probability of being burned out. When a power amplifier is burned out, a power line short circuit would occur inside the respective power amplifier module 210, which may cause other power amplifier modules 210 powered by the same power module 10 to fail to work normally. In the embodiments, the working status of a power amplifier module 210 in which a power line short circuit occurs inside the power amplifier module is defined as an abnormal working status, the power amplifier module 210 in the abnormal working status is defined as an abnormal power amplifier module, and the transmission group 20 to which the abnormal power amplifier module belongs is defined as an abnormal transmission group. It can be understood that other statuses except the abnormal working status may be defined as a normal working status, and the power amplifier module 210 in the normal working status is defined as a normal power amplifier module.

By acquiring the working statuses of the power amplifier modules 210 through the power supply control circuit 30, the abnormal power amplifier module(s) and the abnormal transmission group in which the abnormal power amplifier module(s) is(are) located may be determined, and each normal power amplifier module in the abnormal transmission group may be timely controlled to switch from being connected with a currently connected power module 10 to a target power module, thereby ensuring the normal operation of the normal power amplifier module. In this way, the number of available frequency bands of the radio frequency module after the burning out of a power amplifier module 210 is increased, which improves the user experience and reduces customer return rate. It can be understood that, in some other embodiments, some of the multiple transmission groups may include only one power amplifier module. When the abnormal transmission group only includes one abnormal power amplifier module, the power supply control circuit 30 may not perform the related operation of switching to the target power module. In some implementations, the power supply control circuit 30 may obtain the working status of each power amplifier module 210 according to a status parameter of the power amplifier module 210. The status parameter may include, for example, a voltage parameter, a current parameter or a temperature parameter of the power terminal of the power amplifier module 210. When a power amplifier module 210 is in the abnormal working status, the power line short circuit would cause a change in the status parameter. For example, the voltage parameter of the power terminal of the power amplifier module 210 may be suddenly changed to zero, and the current parameter and the temperature parameter thereof may increase abnormally. Therefore, the working status of the power amplifier module 210 may be obtained according to the status parameter(s) of the power amplifier module 210. In some implementations, the power supply control circuit 30 may also acquire the working status of each power amplifier module 210 according to a status signal capable of directly reflecting the status of the power amplifier module 210. Further, in some implementations, a circuit with corresponding functions may be provided between the power supply control circuit 30 and the power amplifier module 210 to acquire the aforementioned status parameter or status signal. For example, a sampling circuit may be provided, and the sampling circuit samples the status parameter(s) of the power amplifier module 210 and feeds back the status parameter(s) to the power supply control circuit 30. For example, a detection circuit may be provided, and the detection circuit generates a status signal of the working status according to the status parameter(s) of the power amplifier module 210, and feeds back the status signal to the power supply control circuit 30. For example, the power supply control circuit 30 itself may also have a function of collecting the status parameters. It can be understood that the way of acquiring the working statuses of the power amplifier modules 210 is not limited to those in the above-mentioned embodiments, and embodiments adopting other manners are not further listed here.

The radio frequency module provided in the embodiments includes at least two power modules 10, at least two transmission groups 20 and a power supply control circuit 30. Each transmission group 20 includes at least two power amplifier modules 210. Each power amplifier module 210 is switchably connected to any one of the at least two power modules 10. The individual power amplifier modules 210 in a same transmission group 20 are configured to perform power amplification on received radio frequency signals under power supply of a same power module. By acquiring the working status of each power amplifier module 210 through the power supply control circuit 30, an abnormal transmission group in which there is an abnormal power amplifier module may be determined, and each normal power amplifier module in the abnormal transmission group may be timely controlled to switch from being connected with the currently connected power module 10 to the target power module, thereby ensuring the normal operation of each normal power amplifier module. This increases the number of available frequency bands of the radio frequency module after burning out of a power amplifier module 210, improves the user experience and reduces the customer return rate.

Figure 2:
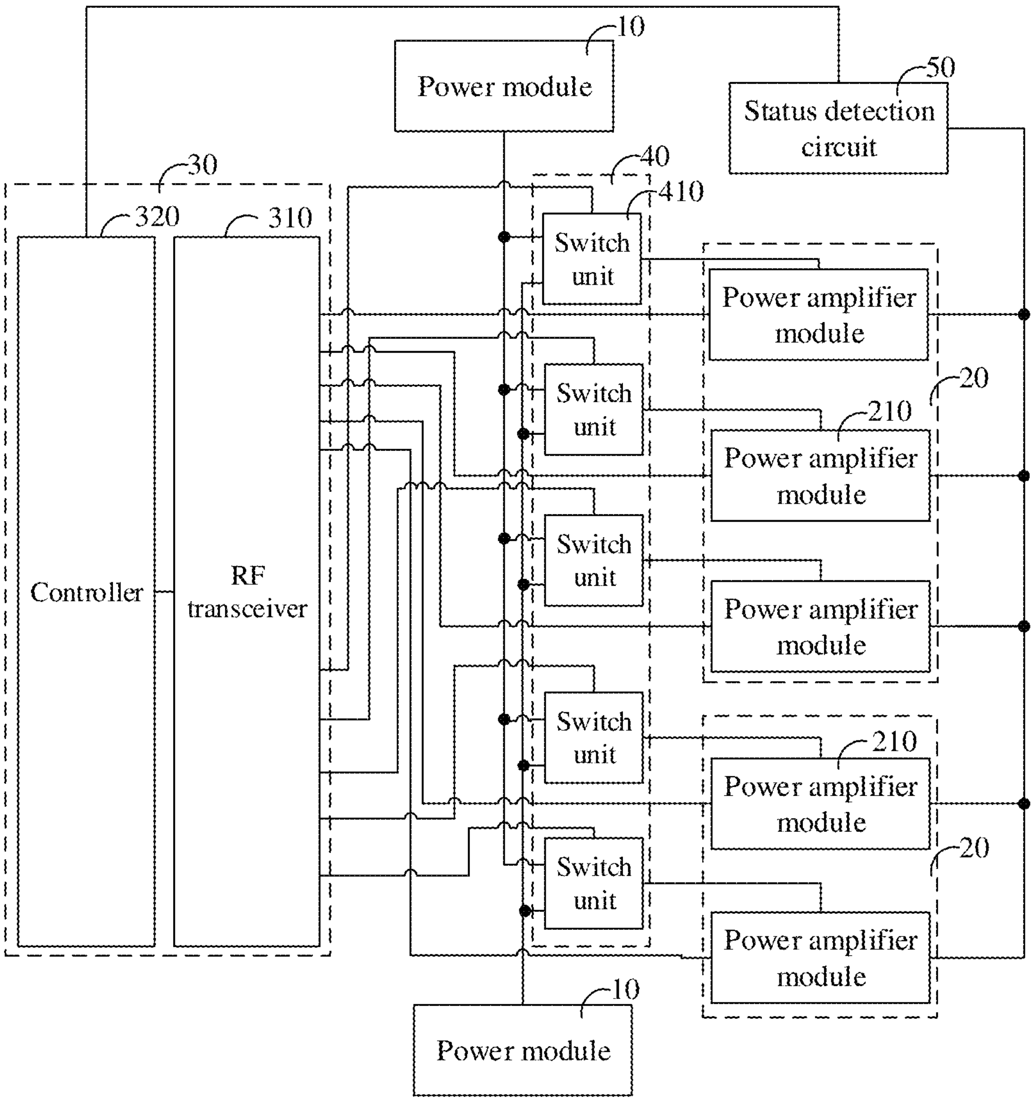
FIG. 2 is a second structural block diagram of the radio frequency module according to some embodiments.

In some embodiments, as illustrated in FIG. 2, the radio frequency module further includes a switch module 40, and the power supply control circuit 30 controls each power amplifier module 210 to be connected with or disconnected from a power module 10 by controlling the on/off state of the switch module 40.

The switch module 40 has a controlled terminal, multiple first terminals and multiple second terminals. Each first terminal of the switch module 40 is connected to one power module 10, and at least some of the multiple first terminals are connected to a same power module 10. Each second terminal of the switch module 40 is connected to the power terminal of one power amplifier module 210. The controlled terminal of the switch module 40 is connected to the power supply control circuit 30. The switch module 40 is configured to switch, under control of the power supply control circuit 30, the normal power amplifier module in the abnormal transmission group from being connected with the currently connected power module 10 to being connected with the target power module.

The switch module 40 is connected to the power supply control circuit 30 through the controlled terminal, connected to the multiple power modules 10 respectively through the multiple first terminals, and connected to the multiple power amplifier modules 210 respectively through the multiple second terminals. Under the control of the power supply control circuit 30, the switch module 40 switches the normal power amplifier module in the abnormal transmission group to being connected with the target power module.

In some implementations, a default power module 10 may be selected as the currently connected power module. When each power amplifier module 210 is in the normal working status, each power amplifier module 210 is brought into connection with its default power module 10 through a switching operation of the switch module 40, so that each default power module 10 supplies power to its default connected transmission group 20. When there is an abnormal power amplifier module, the switch module 40 performs a switching operation to disconnect other normal power amplifier modules in the transmission group 20 where the abnormal power amplifier module is located from the default power module 10, and also bring the normal power amplifier modules to being connected with other power modules 10.

By means of the power supply control circuit 30 and the switch module 40, when an abnormality occurs in a power amplifier module 210, each normal power amplifier modules in the abnormal transmission group can be switched to being connected with the target power module in time, thereby ensuring that such normal power amplifier module can continue working normally.

In some embodiments, the switch module 40 is further configured to disconnect the abnormal power amplifier module from its currently connected power module, under the control of the power supply control circuit 30.

When a PA inside a power amplifier module 210 is burned out, an abnormally large current would be generated in the power supply path between the abnormal power amplifier module and its connected power module. When the power supply control circuit 30 determines the abnormal power amplifier module based on the working statuses of the individual power amplifier modules 210, the switch module 40 is timely controlled to disconnect the abnormal power amplifier module from its currently connected power module, so as to avoid an abnormally large current from being continuously generated in the power amplifier module 210 which would otherwise lead to severe heating.

In some embodiments, as illustrated in FIG. 2, the power supply control circuit 30 may include a radio frequency transceiver 310 and a controller 320.

The controller 320 is configured to acquire the working status of each power amplifier module 210, and generate a power switching instruction when the working status is an abnormal working status, the power switching instruction carrying parameter information of the abnormal transmission group and the normal power amplifier module(s) therein. The radio frequency transceiver 310 is connected with each of the controller 320, the input terminal of each power amplifier module 210, and the controlled terminal of the switch module 40. The radio frequency transceiver 310 is configured to provide the radio frequency signals, and control, according to the power switching instruction, the switch module 40 to switch each normal power amplifier module in the abnormal transmission group from being connected with the currently connected power module 10 to being connected with the target power module.

The controller 320 is connected with the radio frequency transceiver 310. The controller 320 can acquire the working status of each power amplifier module 210, and generate a power switching instruction when the working status is an abnormal working status, to instruct the radio frequency transceiver 310 to perform a corresponding operation. The manner in which the controller 320 acquires the working status of each power amplifier module 210 may refer to the relevant description in the above embodiments, which will not be repeated here. In some implementations, when the radio frequency module is applied in a communication device, the controller 320 may be an application processor (AP) or a baseband processor in the communication device. Taking the controller 320 as an AP as an example, when the AP finds an abnormal power amplifier module based on the working statuses of the individual power amplifier modules 210, it notifies, by means of the power switching instruction, the radio frequency transceiver 310 to perform a corresponding operation.

The radio frequency transceiver 310 is connected with each of the controller 320, the input terminal of each power amplifier module 210, and the controlled terminal of the switch module 40. The radio frequency transceiver 310 may provide radio frequency signals to the power amplifier modules 210, and may also receive the power switching instruction output by the controller 320. Since the power switching instruction carries the parameter information of the abnormal transmission group and the normal power amplifier module(s), the radio frequency transceiver 310 may generate, based on the parameter information, a corresponding control signal to control the switch module 40 to performing the switching to the target power module.

Through the interaction between the controller 320 and the radio frequency transceiver 310, the abnormal power amplifier module may be found in time, and the on/off state of the switch module 40 may be controlled in time, so that the switch module 40 may switch in time the normal power amplifier module(s) in the abnormal transmission group to being connected with the target power module, thereby ensuring the normal operation of the normal power amplifier module(s).

In some embodiments, still referring to FIG. 2, the switch module 40 includes multiple switch units 410, and the radio frequency transceiver 310 controls the on/off state of each switch unit 410 to switch the normal power amplifier module(s) in the abnormal transmission group to being connected with the target power module.

Each of the multiple switch units 410 has a controlled terminal, at least two first terminals and a second terminal (two first terminals and one second terminal are illustrated as an example in FIG. 2). The at least two first terminals of each switch unit 410 are respectively connected to the at least two power modules 10, and the second terminal of each switch unit 410 is connected to one power amplifier module 210. The radio frequency transceiver 310 is configured with multiple control interfaces, and each control interface is connected to the controlled terminal of one switch unit 410. The radio frequency transceiver 310 is configured to generate a control signal according to the power switching instruction, and send the control signal to a target switch unit 410 through a respective control interface, so as to control the target switch unit 410 to switch the normal power amplifier module in the abnormal transmission group from being connected with its currently connected power module to being connected with the target power module, where the target switch unit 410 is connected with the normal power amplifier module.

The switch unit 410 is provided on the connection path between each power amplifier module 210 and the power modules 10. By controlling the on/off states of the switch units 410, the power supply of the power modules 10 to each power amplifier module 210 may be controlled. The control signal includes a turn-on signal and a turn-off signal. The turn-on signal is used to control the switch unit 410 to bring the respective connection path that was originally in a disconnected state into being in a connected state, and the turn-off signal is used to control the switch unit 410 to bring the respective connection path that was originally in a connected state into being in a disconnected state.

When the radio frequency transceiver 310 receives a power switching instruction, the radio frequency transceiver 310 determines, based on the parameter information carried in the power switching instruction, a target switch unit 410 that needs to perform the switching to the target power module, generates a control signal and sends the control signal through a respective control interface to the corresponding target switch unit 410, so as to control the target switch unit 410 to perform the switching to the target power module. By providing the multiple switch units 410 with each switch unit 410 being arranged on the connection path between each power amplifier module 210 and the power modules 10, the on/off state of each switch unit 410 may be independently controlled, and the switching to the target power module can be performed more accurately.

In some implementations, the control interface of the radio frequency transceiver 310 includes a mobile industry processor interface (MIPI) or a general purpose input output (GPIO) interface. The radio frequency transceiver 310 may send a control signal to the switch unit 410 by controlling the level of the MIPI or GPIO interface to be changed, thereby improving the control efficiency.

In some implementations, each switch unit 410 includes at least one switch element, which may be for example a single-pole multi-throw switch. For example, when the power amplifier module 210 is capable of being connected with two power modules 10, the switch unit 410 may be a single-pole double-throw switch, and the two first terminals of the single-pole double-throw switch are respectively connected to the output terminals of the two power modules 10, and the second terminal of the single-pole double-throw switch is connected to the power terminal of the power amplifier module 210. The single-pole double-throw switch may be configured to make one of the power modules 10 connected with the power amplifier module 210 by default, and make the other power module 10 disconnected from the power amplifier module 210. When the power supply control circuit 30 determines an abnormal power amplifier module, the single-pole double-throw switch disconnects the normal power amplifier module from the power module 10 that also supplies power to the abnormal power amplifier module, and connects the normal power amplifier module to the other power module 10, thereby achieving the switching to the target power module.

In some embodiments, the switch unit 410 may be provided outside the power amplifier module 210 (in the embodiment of FIG. 2, it is illustrated by taking a case where the switch unit 410 is external to the power amplifier module as an example, and auxiliary reference may be made to FIG. 2). Each power amplifier module 210 may be configured with a power interface and an input interface, the power interface is connected to the second terminal of the switch unit 410, and the input interface is connected to a transmission interface of the radio frequency transceiver 310. The power interface is used to receive the power supply signal of the power module 10, and the input interface is used to receive the radio frequency signal output by the radio frequency transceiver 310.

Figure 3:
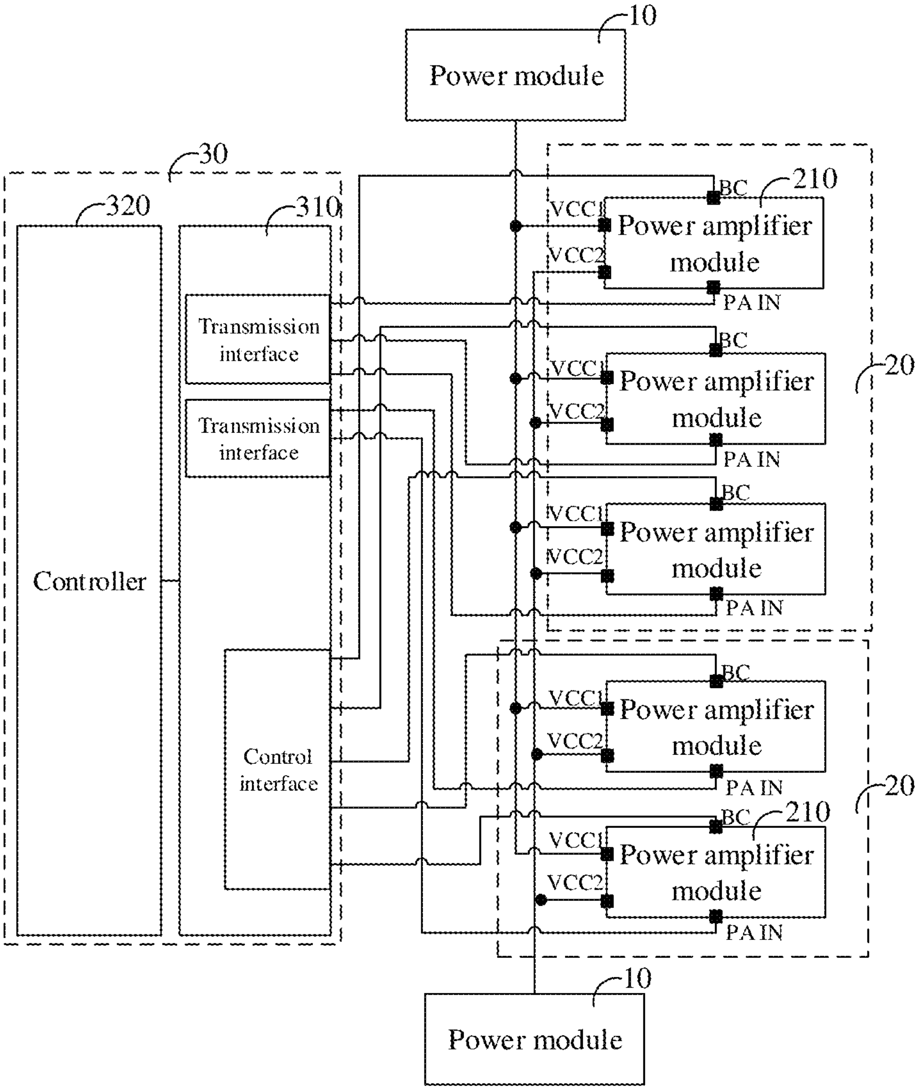
FIG. 3 is a third structural block diagram of the radio frequency module according to some embodiments.

In some embodiments, the switch unit 410 may be integrated in the power amplifier module 210. As illustrated in FIG. 3, each power amplifier module 210 includes a power amplifier, and each power amplifier module 210 is configured with at least two power interfaces, a controlled interface and an input interface (in FIG. 3, it is illustrated by taking two power interfaces as an example, the two power interfaces are VCC1 and VCC2, the input interface is PA IN, and the controlled interface is BC; the power amplifier and the switch unit 410 are not shown in the figure). The at least two power interfaces are respectively connected to the at least two power modules 10, the controlled interface is connected to a control interface of the radio frequency transceiver 310, and the input interface is connected with each of a transmission interface of the radio frequency transceiver 310 and an input terminal of the power amplifier. Each switch unit 410 is integrated in a corresponding power amplifier module 210, the at least two first terminals of the switch unit 410 are respectively connected to the at least two power interfaces, the second terminal of the switch unit 410 is connected to a power terminal of the power amplifier, and the controlled terminal of the switch unit 410 is connected to the controlled interface.

The power amplifier module 210 is configured with the at least two power interfaces, the controlled interface and the input interface. Each switch unit 410 is integrated in the corresponding power amplifier module 210, the first terminals of the switch unit 410 are connected to the external power modules 10 through the power interfaces, the second terminal of the switch unit 410 is connected to the power amplifier of the power amplifier module 210, and the controlled terminal of the switch unit 410 is connected to the external radio frequency transceiver 310 through the controlled interface. By integrating the switch unit 410 inside the power amplifier module 210, the area of the mainboard occupied by the radio frequency module can be reduced, the integration level can be improved, and it is beneficial to the miniaturization of the radio frequency module and the reduction of costs.

It can be understood that, when the power amplifier module 210 includes multiple power amplifiers, the switch unit 410 may also have multiple second terminals, and each second terminal is connected to a power terminal of one power amplifier. It can be understood that the power amplifier module 210 is further configured with an output interface, and the output interface may be connected to an antenna through a radio frequency front-end circuit.

In some other embodiments, the switch unit 410 may also be integrated into the power module 10. For example, multiple switch units 410 corresponding to the default power module 10 in the above embodiments may be integrated inside the default power module 10 to improve the integration level, which is also conducive to the miniaturization of the radio frequency module and the reduction of costs.

In some embodiments, the radio frequency module may further include a status detection circuit (for example, as indicated by 50 in FIG. 2), and the power supply control circuit 30 acquires the working status of each power amplifier module 210 through the status detection circuit.

The status detection circuit is connected to each of the controller 320 and the power amplifier module 210. The status detection circuit is configured to detect the working status of each power amplifier module 210 and feedback the working status to the controller 320. Specifically, the status detection circuit may detect the status parameter(s) of the power amplifier module 210, determine the working status of the power amplifier module 210 based on the status parameter(s), and feedback the working status to the controller 320 for acquisition by the controller 320.

In some implementations, the status detection circuit may generate, based on the status detection result, a signal indicating a change of a status flag bit. For example, when an abnormal power amplifier module is detected, a high or low level signal is generated. The high or low level signal is used to indicate to the controller 320 that a corresponding power amplifier module 210 is in an abnormal working status. In some implementations, the status detection circuit may be a voltage detection circuit, a current sampling circuit, a temperature detection circuit, etc., which is used to detect the working status of the power amplifier module 210 based on the status parameter(s) of the power amplifier module 210. It can be understood that, when the status detection circuit is a voltage detection circuit or a current sampling circuit, the status detection circuit may be connected with the power amplifier module 210; and when the status detection circuit is a temperature detection circuit, the status detection circuit may not be connected with the power amplifier module 210, and the temperature parameter may be obtained by detecting the temperature of the environment surrounding the power amplifier module 210.

In some implementations, there may be one status detection circuit, and the status detection circuit may have multiple detection terminals and multiple feedback terminals. Each detection terminal may be connected to one power amplifier module 210, and each feedback terminal is connected to one feedback receiving terminal of the controller 320. The status detection circuit is configured to feedback the working status obtained by each detection terminal to the corresponding feedback terminal, so that the controller 320 may determine the working status of each power amplifier module 210 based on the status signals received by the feedback receiving terminals.

Figure 4:
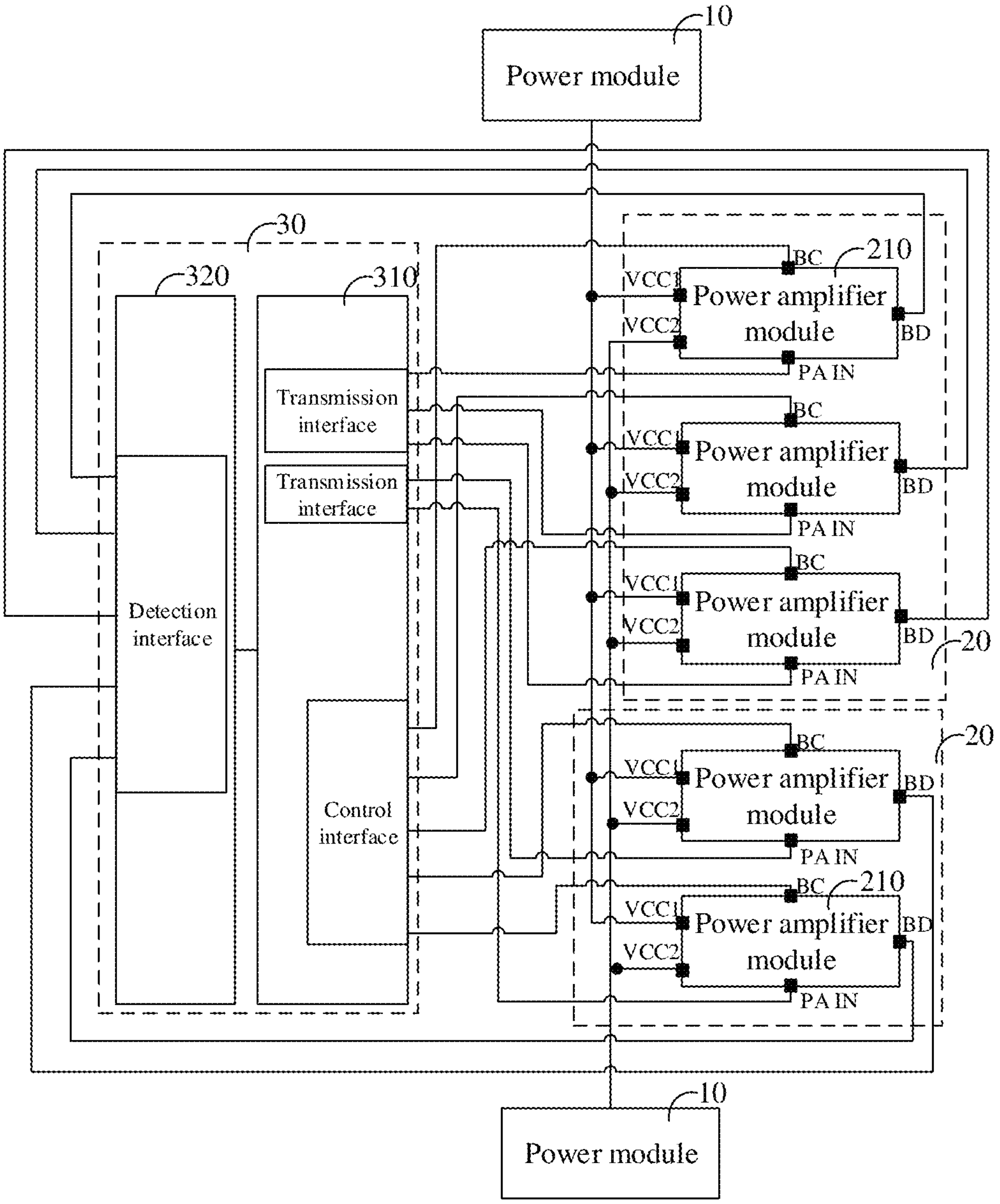
FIG. 4 is a fourth structural block diagram of the radio frequency module according to some embodiments.

In some implementations, there may be multiple status detection circuits. As illustrated in FIG. 4, each power amplifier module 210 is further configured with a status feedback interface (as indicated by BD in the figure). Each status detection circuit is integrated in one corresponding power amplifier module 210, and the feedback terminal of each status detection circuit is connected to a detection interface of the controller 320 through the status feedback interface, and the detection terminal of each status detection circuit is connected to the power terminal of the power amplifier (the power amplifier and the status detection circuit are not shown in the figure).

By integrating each status detection circuit inside the power amplifier module 210, in one aspect, the area of the mainboard occupied by the radio frequency module can be reduced, the integration level can be improved, and it is beneficial to the miniaturization of the radio frequency module and the reduction of costs. In another aspect, a detection distance between the status detection circuit and the power terminal of the power amplifier can be shortened, thereby improving the detection accuracy of the status detection circuit.

In some embodiments, the power supply control circuit 30 is further configured to acquire a target frequency band of the radio frequency signal for which the power amplification is supported by the abnormal power amplifier module, and update an available network search frequency band based on the target frequency band. The available network search frequency band is a frequency band at which the radio frequency module supports for radio frequency signal transmission in a target standard network.

The target frequency band is a frequency band of a radio frequency signal for which the abnormal power amplifier module supports power amplification. When a power amplifier module 210 is in an abnormal status, it means that the target frequency band supported by the power amplifier module 210 is no longer available.

The available network search frequency band is a frequency band at which the radio frequency module supports radio frequency signal transmission in the target standard network. The updating the available network search frequency band based on the target frequency band may include removing the target frequency band from the original available network search frequency band. The target standard network may be in one or more network standards, including for example Global System for Mobile Communications (GSM), Universal Mobile Telecommunications System (UMTS), Long Term Evolution (LTE) and New Radio (NR), and each network standard may include multiple frequency bands, which is not further limited in the embodiments. Taking the LTE network standard and NR network standard as an example, each of an LTE signal and a NR signal includes a low-frequency signal, a medium-frequency signals, a high-frequency signal and an ultra-high frequency signal. The frequency band division of the low-frequency signal, the medium-frequency signal, the high-frequency signal and the ultra-high frequency signal may be referred to the following table.

| Frequency Band | LTE signal frequency band | NR signal frequency band |
|---|---|---|
| L: Low frequency | B5, B8, B12, B13, B14, B17, B18, B19, B20, B26, B28A | N5, N8, N12, N13, N14, N17, N18, N19, N20, N26, N28A |

-continued

| Frequency Band | LTE signal frequency band | NR signal frequency band |
|---|---|---|
| M: Medium frequency | B1, B2, B3, B4, B25, B34, B39, B66 | N1, N2, N3, N4, N25, N34, N39, N66 |
| H: High frequency | B7, B30, B38, B40, B41 | N7, N30, N38, N40, N41 |
| UH: Ultra-high frequency | | N77, N78, N79 |

It is notable that the 5G network uses the same frequency band as 4G, and only the identifier before the number is changed. In addition, the 5G network has added some ultra-high frequency bands that are not available in the 4G network, such as N77, N78 and N79.

When the radio frequency module is applied in a communication device, the communication device usually needs to search for a network during operation. In the related art, the network search process usually attempts to search all frequency bands supported by the radio frequency module. When a power amplifier module 210 is in an abnormal status, it means that the target frequency band supported by the power amplifier module 210 is no longer available, and the searching for the unavailable frequency band may cause a crashing risk of the device. In the embodiments, the updated available network search frequency band removes the target frequency band, which allows the device to skip the unavailable frequency band when performing a network search operation. Thus, this not only reduces the power consumption caused by the network search, but also shortens the network search time and speeds up the communication service.

In some implementations, the controller 320 in the power supply control circuit 30 may acquire the target frequency band of the radio frequency signal for which power amplification is supported by the abnormal power amplifier module, and update the available network search frequency band based on the target frequency band. In some implementations, the controller 320 may also establish a network search list based on the updated available network search frequency band, so that the device may perform the network search operation according to the network search list. By establishing the network search list, the network search speed of the device can be further improved.

The above embodiments are further described below by taking, as an example, a case where the at least two power modules include a first power module and a second power module, and the at least two transmission groups include a first transmission group and a second transmission group.

The first transmission group includes a low-frequency power amplifier module, a medium-high frequency amplifier module and a first ultra-high frequency amplifier module each capable of being connected to the first power module and the second power module. The low-frequency power amplifier module is configured to support power amplification of low-frequency signals, the medium-high frequency amplifier module is configured to support power amplification of medium-frequency signals and high-frequency signals, and the first ultra-high frequency amplifier module is configured to support power amplification of ultra-high frequency signals. Each power amplifier module in the first transmission group is connected to the first power module by default. The second transmission group includes a high-frequency amplifier module and a second ultra-high frequency amplifier module each capable of being connected to the first power module and the second power module. The high-frequency amplifier module is configured to support power amplification of high-frequency signals, and the second ultra-high frequency amplifier module is configured to support power amplification of ultra-high frequency signals. Each power amplifier module in the second transmission group is connected to the second power module by default.

The power supply control circuit 30 is configured to: when the first transmission group includes at least one abnormal power amplifier module and the second transmission group does not include an abnormal power amplifier module, switch each normal power amplifier module in the first transmission group from being connected with the currently connected first power module to being connected with the second power module; alternatively, when the second transmission group includes at least one abnormal power amplifier module and the first transmission group does not include an abnormal power amplifier module, switch each normal power amplifier module in the second transmission group from being connected with the currently connected second power module to being connected with the first power module.

Figure 5:
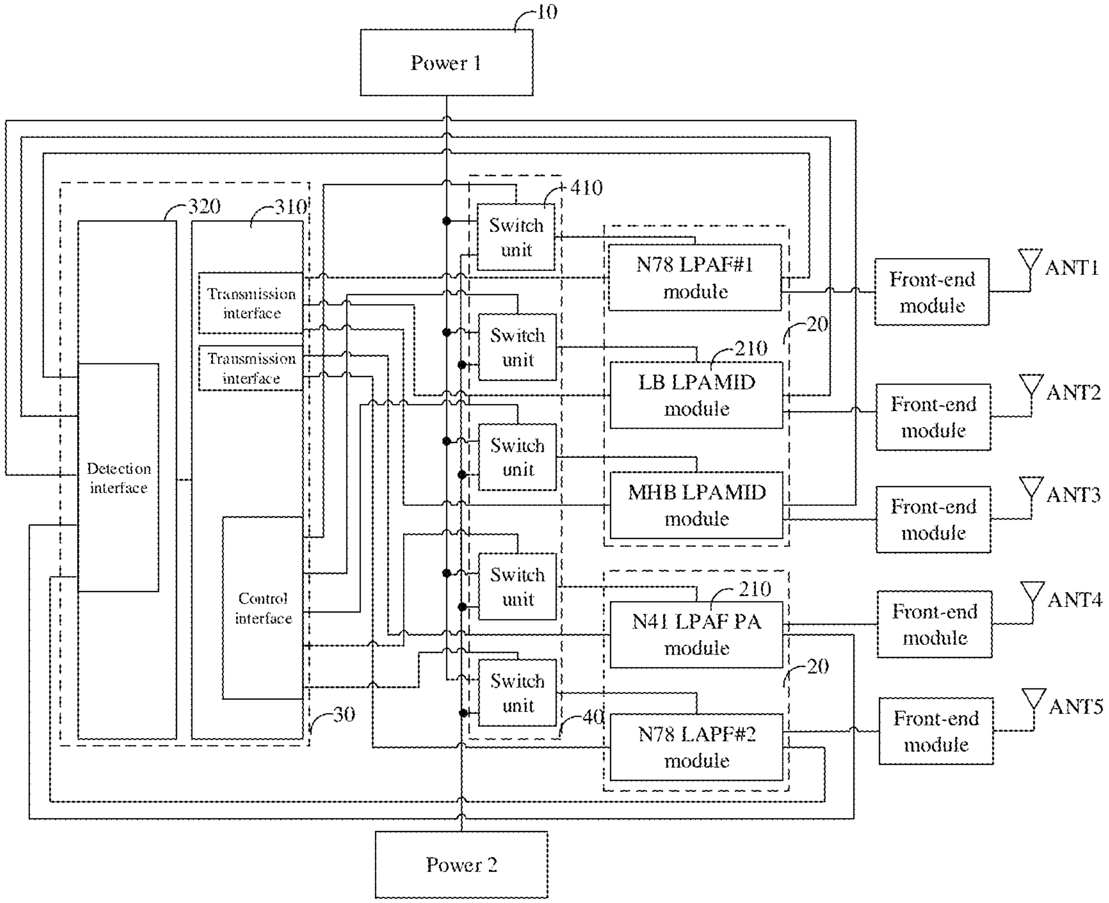
FIG. 5 is a fifth structural block diagram of the radio frequency module according to some embodiments.

As illustrated in FIG. 5 (in this figure, it is illustrated by taking, as an example, a case where the power supply control circuit 30 includes the radio frequency transceiver 310 and the controller 320, the radio frequency module further includes the status detection circuit and the switch module 40, and the switch module 40 includes multiple switch units 410), the low-frequency power amplifier module, the medium-high frequency amplifier module and the first ultra-high frequency amplifier module of the first transmission group are powered by the first power module by default, and the high frequency amplifier module and the second ultra-high-frequency amplifier module of the second transmission group are powered by the second power module by default. The first power module is power supply 1, and the second power module 10 is power supply 2. The low-frequency amplifier module may be an LB LPAMID module, the medium-high frequency amplifier module may be an MHB LPAMID module, and the first ultra-high frequency amplifier module may be an N78 LPAF #1 module. The high-frequency amplifier module may be an N41 LPAF PA module, and the second ultra-high frequency amplifier module may be an N78 LAPF #2 module. The controller 320 may be an AP. The LB LPAMID module, the MHB LPAMID module, the N78 LPAF #1 module, the N41 LPAF PA module and the N78 LAPF #2 module each may be connected to a corresponding antenna (ANT1, ANT2, ANT3, ANT4 and ANT5 in the figure) through a front-end module.

Assuming that a short circuit occurs in the LB LPAMID module due to burning out of PA, the AP determines, by means of the status detection circuit, that the LB LPAMID module is in an abnormal working status, determines the first transmission group as an abnormal transmission group, and then generates a power switching instruction to notify the radio frequency transceiver 310. The radio frequency transceiver 310 generates a control signal according to the power switching instruction, and sends, through the MIPI or GPIO interface, the control signal to the switch units 410 corresponding to the MHB LPAMID module and the N78 LPAF #1 module, to control the switch units 410 to switch the currently connected first power module to the second power module. In addition, the AP may remove low-frequency bands, such as B5, B8, B28, N5, N8, and N28, from the network search list.

Assuming that a short circuit occurs in the N78 LAPF #2 module due to burning out of PA, the AP determines, by means of the status detection circuit, that the N78 LAPF #2 module is in an abnormal working status, determines the second transmission group as an abnormal transmission group, and then generates a power switching instruction to notify the radio frequency transceiver 310. The radio frequency transceiver 310 generates a control signal according to the power switching instruction, and sends, through the MIPI or GPIO interface, the control signal to the switch unit 410 corresponding to the N41 LPAF module, to control the switch unit 410 to switch the currently connected second power module to the first power module. In addition, the AP may remove the N78 ultra-high frequency band from the network search list.

It can be understood that the probability of short circuit caused due to burning out of PA is usually low, and there is also a low probability that the first emission group and the second emission group simultaneously have an abnormal power amplifier module therein. Therefore, the target power module is usually switched between the first power module and the second power module. In order to avoid the extremely small probability that the first emission group and the second emission group simultaneously have an abnormal power amplifier module therein, a third power module may be added to serve as an alternative for the switching to the target power module.

The division of various modules and circuits in the above-mentioned radio frequency module is only for illustration. In other embodiments, the radio frequency module may be divided into different circuits as needed to implement all or part of the functions of the above-mentioned radio frequency module.

Figure 6:
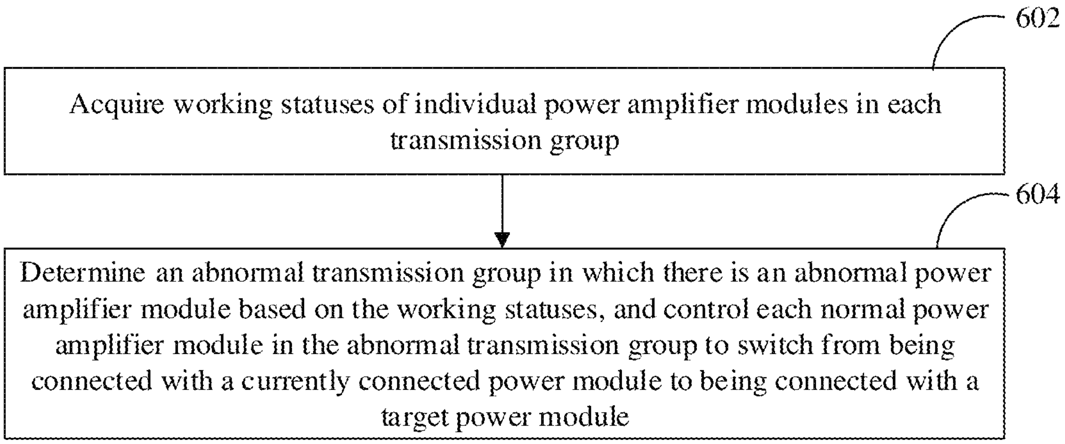
FIG. 6 is a first flowchart of a power supply control method according to some embodiments.

FIG. 6 is a method flow chart of a power supply control method according to some embodiments. As illustrated in FIG. 6, in the embodiments, the power supply control method includes operations 602 to 604.

At 602, working statuses of individual power amplifier modules in each transmission group are acquired.

At 604, an abnormal transmission group in which there is an abnormal power amplifier module is determined based on the working statuses, and each normal power amplifier module in the abnormal transmission group is controlled to switch from being connected with a currently connected power module to being connected with a target power module.

The target power module is any one of at least two power modules except the currently connected power module. There are at least two transmission groups, each transmission group includes at least two power amplifier modules, and each power amplifier module is switchably connected to any one of the at least two power modules. The individual power amplifier modules in a same transmission group are configured to perform power amplification on received radio frequency signals under the power supply of a same power module.

For the transmission groups, the power amplifier modules, the power modules, and the target power module, etc., reference may be made to the relevant description in the above embodiments, which will not be repeated here. Operations 602 to 604 may be executed by the power supply control circuit in the above embodiments, and the details may be referred to the relevant description in the above embodiments, which will not be repeated here.

In some implementations, the operation of controlling each normal power amplifier module in the abnormal emission group to switch to being connected with the target power module may include: controlling a switch module to switch each normal power amplifier module in the abnormal emission group from being connected with the currently connected power module to the target power module. In some implementations, the working status of each power amplifier module may be obtained based on feedback from a status detection circuit. For the switch module and the status detection circuit, reference may be made to the relevant description in the above embodiments, which will not be repeated here.

In the power supply control method provided in the embodiments, an abnormal transmission group in which there is an abnormal power amplifier module may be determined by acquiring the working status of each power amplifier module, so as to timely control each normal power amplifier module in the abnormal transmission group to switch to being connected with the target power module, thereby ensuring that the normal power amplifier module can continue working normally. In this way, the number of available frequency bands of the radio frequency module after the burning out of a power amplifier module is increased, which improves the user experience and reduces the customer return rate.

Figure 7:
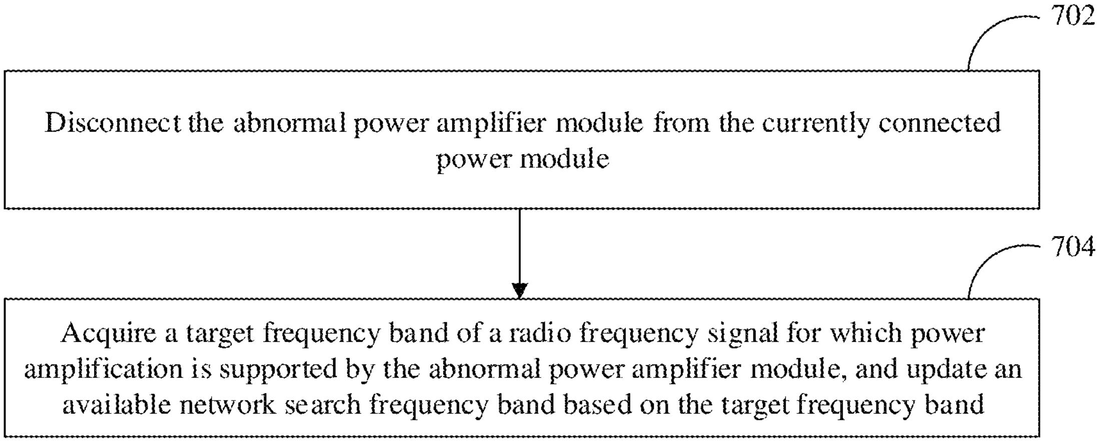
FIG. 7 is a second flowchart of the power supply control method according to some embodiments.

In some embodiments, as illustrated in FIG. 7, the power supply control method further includes operation 702.

At 702, the abnormal power amplifier module is disconnected from the currently connected power module.

This operation may be executed by the power supply control circuit and the switch module in the above embodiments. The details thereof may refer to the relevant description of the above embodiment, which will not be repeated here.

In some embodiments, as illustrated in FIG. 7, the power supply control method further includes operation 704.

At 704, a target frequency band of a radio frequency signal for which power amplification is supported by the abnormal power amplifier module is acquired, and an available network search frequency band is updated based on the target frequency band. The available network search frequency band is a frequency band at which the radio frequency module supports radio frequency signal transmission in a target standard network.

Operation 704 may be executed by the power supply control circuit in the above embodiment. The details thereof may refer to the relevant description of the above embodiments, which will not be repeated here.

It is understandable that, the operations in the flowchart of the above embodiments are displayed in sequence as indicated by the arrows, but these operations are not necessarily executed in the order indicated by the arrows. Unless otherwise specified herein, there is no strict order limitation for the execution of these operations, and these operations may be executed in other orders. Moreover, at least part of the operations in the flowchart of the above embodiments may include multiple sub-operations or multiple stages. These sub-operations or stages are not necessarily executed at the same time, but may be executed at different times. The execution order of these sub-operations or stages is not necessarily sequential, but may be executed in turn or alternately with other operations or at least part of the sub-operations or stages of other operations.

The embodiments of the present disclosure further provide a communication device, which may include the radio frequency module in any of the above embodiments. The communication device can timely control each normal power amplifier module in the abnormal transmission group to switch to being connected with the target power module, thereby ensuring the normal operation of the normal power amplifier module. This increases the number of available frequency bands of the radio frequency module after the burning out of a power amplifier module, which improves the user experience and reduces the customer return rate.

The embodiments of the present disclosure further provide a communication device, which may include at least two power modules, at least two transmission groups, a memory, and a processor. For the power modules and the transmission groups, reference may be made to the relevant description in the above embodiments, which will not be repeated here. The memory stores a computer program which, when being implemented by the processor causes the operations of the power supply control method in the above embodiment to be implemented.

The communication device of the embodiments includes at least two power modules, at least two transmission groups, a memory and a processor. The communication device can timely control each normal power amplifier module in the abnormal transmission group to switch to being connected with the target power module, thereby ensuring the normal operation of the normal power amplifier module. This increases the number of available frequency bands of the radio frequency module after the burning out of a power amplifier module, which improves the user experience and reduces the customer return rate.

Figure 8:
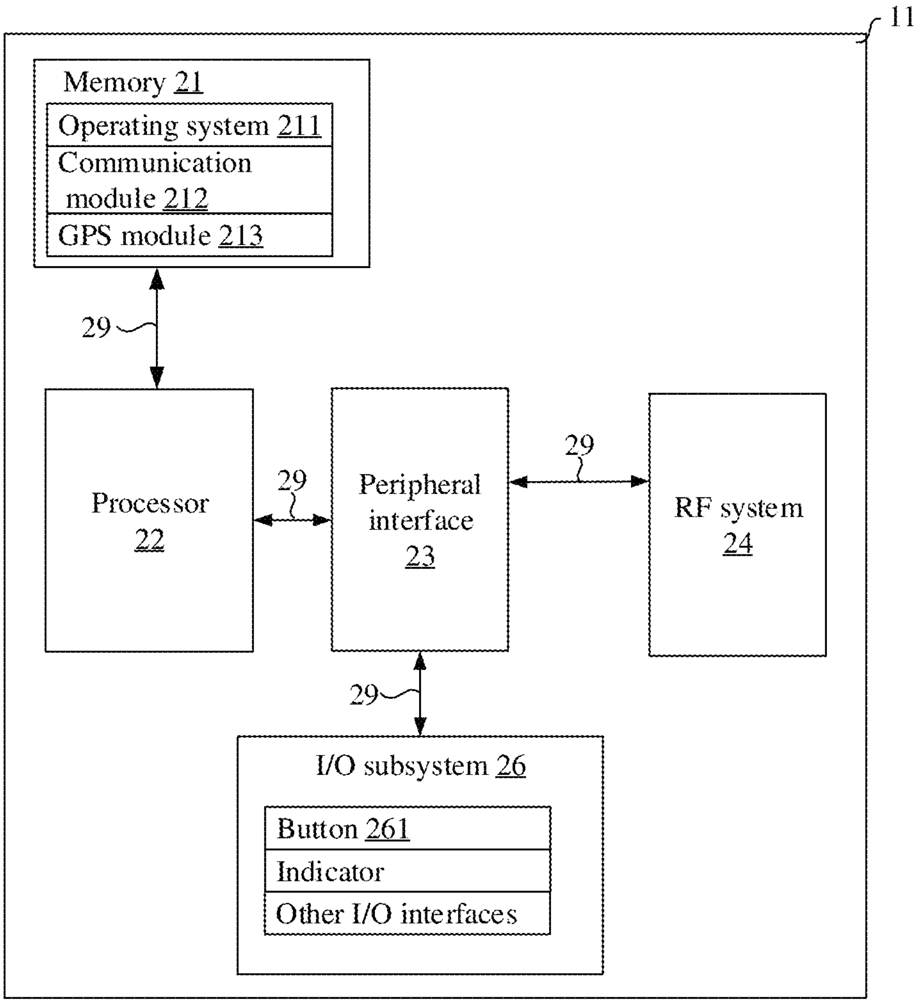
FIG. 8 is a structural block diagram of a communication device according to some embodiments.

As illustrated in FIG. 8, the above-mentioned communication device is further illustrated by taking it as a mobile phone 11 as an example. Specifically, as illustrated in FIG. 8, the mobile phone 11 may include a memory 21 (which optionally includes one or more computer-readable storage medium), a processor 22, a peripheral interface 23, a radio frequency system 24, and an input/output (I/O) subsystem 26. These components optionally communicate with each other via one or more communication buses or signal lines 29. Those skilled in the art would appreciate that the mobile phone 11 shown in FIG. 8 does not constitute a limitation on the mobile phone, and may include more or fewer components than those shown in the figure, or a combination of certain components, or a different arrangement of the components. The various components shown in FIG. 8 are implemented in hardware, software, or a combination of hardware and software, including one or more signal processing and/or application-specific integrated circuits.

The memory 21 optionally includes a high-speed random access memory, and also optionally includes a non-volatile memory, such as one or more disk storage devices, flash memory devices, or other non-volatile solid-state memory devices. Exemplarily, the software components stored in the memory 21 include an operating system 211, a communication module (or an instruction set) 212, a global positioning system (GPS) module (or an instruction set) 213, and the like.

The processor 22 and other control circuits (such as a control circuit in the radio frequency system 24) may be used to control the operations of the mobile phone 11. The processor 22 may be based on one or more microprocessors, microcontrollers, digital signal processors, baseband processors, power management units, audio codec chips, application-specific integrated circuits, and the like.

The processor 22 may be configured to implement a control algorithm that controls the use of the antenna in the mobile phone 11. The processor 22 may also issue control commands for controlling switches in the radio frequency system 24, etc.

The I/O subsystem 26 couples input/output peripherals on the mobile phone 11, such as a keypad and other input control devices, to the peripheral interface 23. The I/O subsystem 26 optionally includes a touch screen, keys, a tone generator, an accelerometer (a motion sensor), an ambient light sensor and other sensors, a light emitting diode and other status indicators, data interfaces, and the like. Exemplarily, a user may control the operations of the mobile phone 11 by providing commands through the I/O subsystem 26, and may receive status information and other output from the mobile phone 11 by using the output resources of the I/O subsystem 26. For example, the user may press a button 261 to turn on or off the mobile phone.

The radio frequency system 24 may include the radio frequency module in any of the aforementioned embodiments.

The embodiments of the present disclosure further provide a computer-readable storage medium, particularly one or more non-transitory computer-readable storage media containing computer-executable instructions which, when being executed by one or more processors, cause the processors to perform the operations of the power supply control method.

The embodiments of the present disclosure further provide a computer program product including instructions which, when being executed on a computer, causes the computer to implement the operations of the power supply control method.

Any memory, storage, database, or other medium referred to herein may include a non-volatile and/or volatile memory. A suitable non-volatile memory may include read only memory (ROM), programmable ROM (PROM), electrically programmable ROM (EPROM), electrically erasable programmable ROM (EEPROM), or a flash memory. The volatile memory may include random access memory (RAM), which acts as an external cache memory. By way of illustration and not limitation, RM is available in a variety of forms, such as static RM (SRM), dynamic RM (DRM), synchronous DRM (SDRM), double data rate SDRM (DDR SDRM), enhanced SDRM (ESDRM), synchronous link (Synchlink) DRM (SLDRM), memory bus (Rmbus) direct RM (RDRM), direct memory bus dynamic RM (DRDRM), and memory bus dynamic RM (RDRM).

The technical features of the above embodiments may be combined arbitrarily. To make the description concise, not all possible combinations of the technical features in the above embodiments are described. However, as long as there is no contradiction in the combination of these technical features, they should be considered to be within the scope of the present disclosure.

The above embodiments only illustrate several implementations of the present disclosure, and the descriptions thereof are relatively specific and detailed, but they should not be construed as limiting the scope of protection of the present disclosure. It should be noted that, for those of ordinary skill in the art, several modifications and improvements can be made without departing from the concept of the present disclosure, which all fall within the scope of protection of the present disclosure. Therefore, the scope of protection of the disclosure should be subjected to the attached claims.

What is claimed is:

1. A radio frequency module, comprising:

at least two power modules;

at least two transmission groups, wherein each of the transmission groups comprises at least two power amplifier modules, each of the power amplifier modules is switchably connected to any one of the at least two power modules, and the individual power amplifier modules in a same transmission group are configured to perform power amplification on received radio frequency signals under power supply of a same power module; and a power supply control circuit, wherein the power supply control circuit is configured to acquire working statuses of the individual power amplifier modules in each of the transmission groups, determine, based on the working statuses, an abnormal transmission group in which there is an abnormal power amplifier module, and control each normal power amplifier module in the abnormal transmission group to switch from being connected with a currently connected power module to being connected with a target power module, the target power module being any one of the at least two power modules except the currently connected power module.

2. The radio frequency module as claimed in claim 1, further comprising:

a switch module having a controlled terminal, a plurality of first terminals and a plurality of second terminals, wherein each of the plurality of first terminals of the switch module is connected to one of the power modules, at least some of the plurality of first terminals are connected to a same power module, each of the plurality of second terminals of the switch module is connected to a power terminal of one of the power amplifier modules, the controlled terminal of the switch module is connected to the power supply control circuit, and the switch module is configured to switch, under control of the power supply control circuit, the normal power amplifier module in the abnormal transmission group from being connected with the currently connected power module to the target power module.

3. The radio frequency module as claimed in claim 2, wherein the switch module is further configured to disconnect, under the control of the power supply control circuit, the abnormal power amplifier module from the currently connected power module.

4. The radio frequency module as claimed in claim 2, wherein the power supply control circuit comprises:

a controller, wherein the controller is configured to acquire the working status of each of the power amplifier modules, and generate a power switching instruction in response to the working status being an abnormal working status, the power switching instruction carrying parameter information of the abnormal transmission group and the normal power amplifier module in the abnormal transmission group; and a radio frequency transceiver, wherein the radio frequency transceiver is connected with each of the controller, input terminals of the power amplifier modules, and the controlled terminal of the switch module, and the radio frequency transceiver is configured to provide the radio frequency signals, and control, according to the power switching instruction, the switch module to switch the normal power amplifier module in the abnormal transmission group from being connected with the currently connected power module to being connected with the target power module.

5. The radio frequency module as claimed in claim 4, wherein the switch module comprises:

a plurality of switch units, wherein each of the plurality of switch units has a controlled terminal, at least two first terminals and a second terminal, the at least two first terminals of each of the plurality of switch units are respectively connected to the at least two power modules, and the second terminal of each of the plurality of switch units is connected to one of the power amplifier modules;

wherein the radio frequency transceiver is configured with a plurality of control interfaces, each of the plurality of control interfaces is connected with the controlled terminal of one of the plurality of switch units; the radio frequency transceiver is configured to generate a control signal according to the power switching instruction, and send the control signal to a target switch unit through a respective control interface, to control the target switch unit to switch the normal power amplifier module in the abnormal transmission group from being connected with the currently connected power module to being connected with the target power module, the target switch unit being connected with the normal power amplifier module in the abnormal transmission group.

6. The radio frequency module as claimed in claim 5, wherein each of the power amplifier modules comprises a power amplifier, and each of the power amplifier modules is configured with at least two power interfaces, a controlled interface and an input interface, the at least two power interfaces are respectively connected to the at least two power modules, the controlled interface is connected with a control interface of the radio frequency transceiver, and the input interface is connected with each of a transmission interface of the radio frequency transceiver and an input terminal of the power amplifier;

wherein each of the plurality of switch units is integrated in a corresponding power amplifier module, the at least two first terminals of each switch unit are respectively connected with the at least two power interfaces of the corresponding power amplifier module, the second terminal of each switch unit is connected with a power terminal of the power amplifier of the corresponding power amplifier module, and the controlled terminal of each switch unit is connected with the controlled interface of the corresponding power amplifier module.

7. The radio frequency module as claimed in claim 5, wherein each of the power amplifier modules is configured with a power interface and an input interface, the power interface is connected with the second terminal of a corresponding switch unit, and the input interface is connected with a transmission interface of the radio frequency transceiver; the power interface is configured to receive a power supply signal of a power module connected with the power amplifier module, and the input interface is configured to receive the radio frequency signal output by the radio frequency transceiver.

8. The radio frequency module as claimed in claim 4, further comprising:

at least one status detection circuit, wherein the at least one status detection circuit is connected with each of the controller and the power amplifier modules, and is configured to detect the working statuses of the power amplifier modules and feedback the working statuses to the controller.

9. The radio frequency module as claimed in claim 8, wherein each of the power amplifier modules is further configured with a status feedback interface, and each of the power amplifier modules comprises a power amplifier;

the at least one status detection circuit comprises a plurality of status detection circuits, each of the plurality of status detection circuits is integrated in a corresponding power amplifier module, a feedback terminal of each of the status detection circuits is connected with a detection interface of the controller through the status feedback interface of the corresponding power amplifier module, and a detection terminal of each of the status detection circuits is connected with a power terminal of the power amplifier of the corresponding power amplifier module.

10. The radio frequency module as claimed in claim 8, wherein the at least one status detection circuit comprises one status detection circuit, the status detection circuit has a plurality of detection terminals and a plurality of feedback terminals, each of the plurality of detection terminals is connected with one of the power amplifier modules, and each of the plurality of feedback terminals is connected with one of feedback receiving terminals of the controller; the status detection circuit is configured to feedback, from a corresponding feedback terminal, the working status obtained through detection of each of the detection terminals; and the controller is configured to determine the working statuses of the individual power amplifier modules, based on status signals received by the feedback receiving terminals.

11. The radio frequency module as claimed in claim 1, wherein the power supply control circuit is further configured to acquire a target frequency band of a radio frequency signal for which power amplification is supported by the abnormal power amplifier module, and update an available network search frequency band based on the target frequency band, the available network search frequency band being a frequency band at which the radio frequency module supports for radio frequency signal transmission in a target standard network.

12. The radio frequency module as claimed in claim 1, wherein the at least two power modules comprise a first power module and a second power module, and the at least two transmission groups comprise:

a first transmission group, comprising a low-frequency power amplifier module, a medium-high frequency amplifier module and a first ultra-high frequency amplifier module each capable of being connected with the first power module and the second power module, wherein the low-frequency power amplifier module is configured to support power amplification of low-frequency signals, the medium-high frequency amplifier module is configured to support power amplification of medium-frequency signals and high-frequency signals, the first ultra-high frequency amplifier module is configured to support power amplification of ultra-high frequency signals, and each power amplifier module in the first transmission group is connected with the first power module by default; and a second transmission group, comprising a high-frequency amplifier module and a second ultra-high frequency amplifier module each capable of being connected with the first power module and the second power module, wherein the high-frequency amplifier module is configured to support power amplification of the high-frequency signals, the second ultra-high frequency amplifier module is configured to support power amplification of the ultra-high frequency signals, and each power amplifier module in the second transmission group is connected with the second power module by default;

wherein the power supply control circuit is configured to, when the first transmission group has at least one abnormal power amplifier module and the second transmission group does not have an abnormal power amplifier module, switch each normal power amplifier module in the first transmission group from being connected with the currently connected first power module to being connected with the second power module; alternatively, when the second transmission group has at least one abnormal power amplifier module and the first transmission group does not have an abnormal power amplifier module, switch each normal power amplifier module in the second transmission group from being connected with the currently connected second power module to being connected with the first power module.

13. A power supply control method, comprising:

acquiring working statuses of individual power amplifier modules in each transmission group of a radio frequency module; and determining, based on the working statuses, an abnormal transmission group in which there is an abnormal power amplifier module, and controlling each normal power amplifier module in the abnormal transmission group to switch from being connected with a currently connected power module to a target power module;

wherein the target power module is any one of at least two power modules of the radio frequency module except the currently connected power module; there are at least two transmission groups, each of the transmission groups comprises at least two power amplifier modules, each of the power amplifier modules is switchably connected to any one of the at least two power modules, and the individual power amplifier modules in a same transmission group are configured to perform power amplification on received radio frequency signals under power supply of a same power module.

14. The power supply control method as claimed in claim 13, further comprising:

acquiring a target frequency band of a radio frequency signal for which power amplification is supported by the abnormal power amplifier module, and updating an available network search frequency band based on the target frequency band, wherein the available network search frequency band is a frequency band at which the radio frequency module supports for radio frequency signal transmission in a target standard network.

15. The power supply control method as claimed in claim 13, further comprising:

disconnecting the abnormal power amplifier module from the currently connected power module.

16. A communication device, comprising a radio frequency module, wherein the radio frequency module comprising:

at least two power modules;

at least two transmission groups, wherein each of the transmission groups comprises at least two power amplifier modules, each of the power amplifier modules is switchably connected to any one of the at least two power modules, and the individual power amplifier modules in a same transmission group are configured to perform power amplification on received radio frequency signals under power supply of a same power module; and a power supply control circuit, wherein the power supply control circuit is configured to acquire working statuses of the individual power amplifier modules in each of the transmission groups, determine, based on the working statuses, an abnormal transmission group in which there is an abnormal power amplifier module, and control each normal power amplifier module in the abnormal transmission group to switch from being connected with a currently connected power module to being connected with a target power module, the target power module being any one of the at least two power modules except the currently connected power module.

17. The communication device as claimed in claim 16, wherein the radio frequency module further comprises:

a switch module having a controlled terminal, a plurality of first terminals and a plurality of second terminals, wherein each of the plurality of first terminals of the switch module is connected to one of the power modules, at least some of the plurality of first terminals are connected to a same power module, each of the plurality of second terminals of the switch module is connected to a power terminal of one of the power amplifier modules, the controlled terminal of the switch module is connected to the power supply control circuit, and the switch module is configured to switch, under control of the power supply control circuit, the normal power amplifier module in the abnormal transmission group from being connected with the currently connected power module to the target power module; and the switch module is further configured to disconnect, under the control of the power supply control circuit, the abnormal power amplifier module from the currently connected power module.

18. The communication device as claimed in claim 17, wherein the power supply control circuit comprises:

a controller, wherein the controller is configured to acquire the working status of each of the power amplifier modules, and generate a power switching instruction in response to the working status being an abnormal working status, the power switching instruction carrying parameter information of the abnormal transmission group and the normal power amplifier module in the abnormal transmission group; and a radio frequency transceiver, wherein the radio frequency transceiver is connected with each of the controller, input terminals of the power amplifier modules, and the controlled terminal of the switch module, and the radio frequency transceiver is configured to provide the radio frequency signals, and control, according to the power switching instruction, the switch module to switch the normal power amplifier module in the abnormal transmission group from being connected with the currently connected power module to being connected with the target power module.

19. The communication device as claimed in claim 18, wherein the radio frequency module further comprises:

at least one status detection circuit, wherein the at least one status detection circuit is connected with each of the controller and the power amplifier modules, and is configured to detect the working statuses of the power amplifier modules and feedback the working statuses to the controller.

20. The communication device as claimed in claim 16, wherein the power supply control circuit is further configured to acquire a target frequency band of a radio frequency signal for which power amplification is supported by the abnormal power amplifier module, and update an available network search frequency band based on the target frequency band, the available network search frequency band being a frequency band at which the radio frequency module supports for radio frequency signal transmission in a target standard network.

* * * * *